United States Patent [19]

Miyano et al.

[11] Patent Number: 5,590,084

[45] Date of Patent: Dec. 31, 1996

[54] SEMICONDUCTOR MEMORY DEVICE HAVING A COLUMN SELECTOR

[75] Inventors: Shinji Miyano; Katsuhiko Sato, both of Yokohama; Tomoaki Yabe, Kawasaki, all of Japan

[73] Assignee: Kabushiki Kaisha Toshiba, Kawasaki, Japan

[21] Appl. No.: 419,688

[22] Filed: Apr. 11, 1995

[30] Foreign Application Priority Data

Apr. 13, 1994 [JP] Japan .................................. 6-074549

[51] Int. Cl.[6] .................................................. G11C 7/00
[52] U.S. Cl. ............................. 365/230.01; 365/189.01; 365/230.06
[58] Field of Search ....................... 365/230.01, 230.06, 365/189.01

[56] References Cited

U.S. PATENT DOCUMENTS 4,965,770   10/1990   Yanagisawa .................... 365/238.5

FOREIGN PATENT DOCUMENTS

0401792A2   12/1990   European Pat. Off. .
4118804A1   12/1991   Germany .

OTHER PUBLICATIONS

Patent Abstracts of Japan, vol. 13, No. 197 (P–868), May 11, 1989.

Patent Abstracts of Japan, vol. 14, No. 98 (P–1011), Feb. 22, 1990.

*Primary Examiner*—David C. Nelms
*Assistant Examiner*—F. Niranjan
*Attorney, Agent, or Firm*—Banner & Allegretti, Ltd.

[57] ABSTRACT

A semiconductor memory device comprises column decoders of the number greater than the number of column addresses of a memory cell array and logical circuits of the same number as that of the column addresses. A column gate of a column is controlled by means of a logical OR between outputs from a plurality of column decoders for decoding different column addresses. As a result, even a column located at an end of the memory cell array can be accessed by means of a logical OR between outputs from a column decoder corresponding to the column and another column decoder.

30 Claims, 7 Drawing Sheets

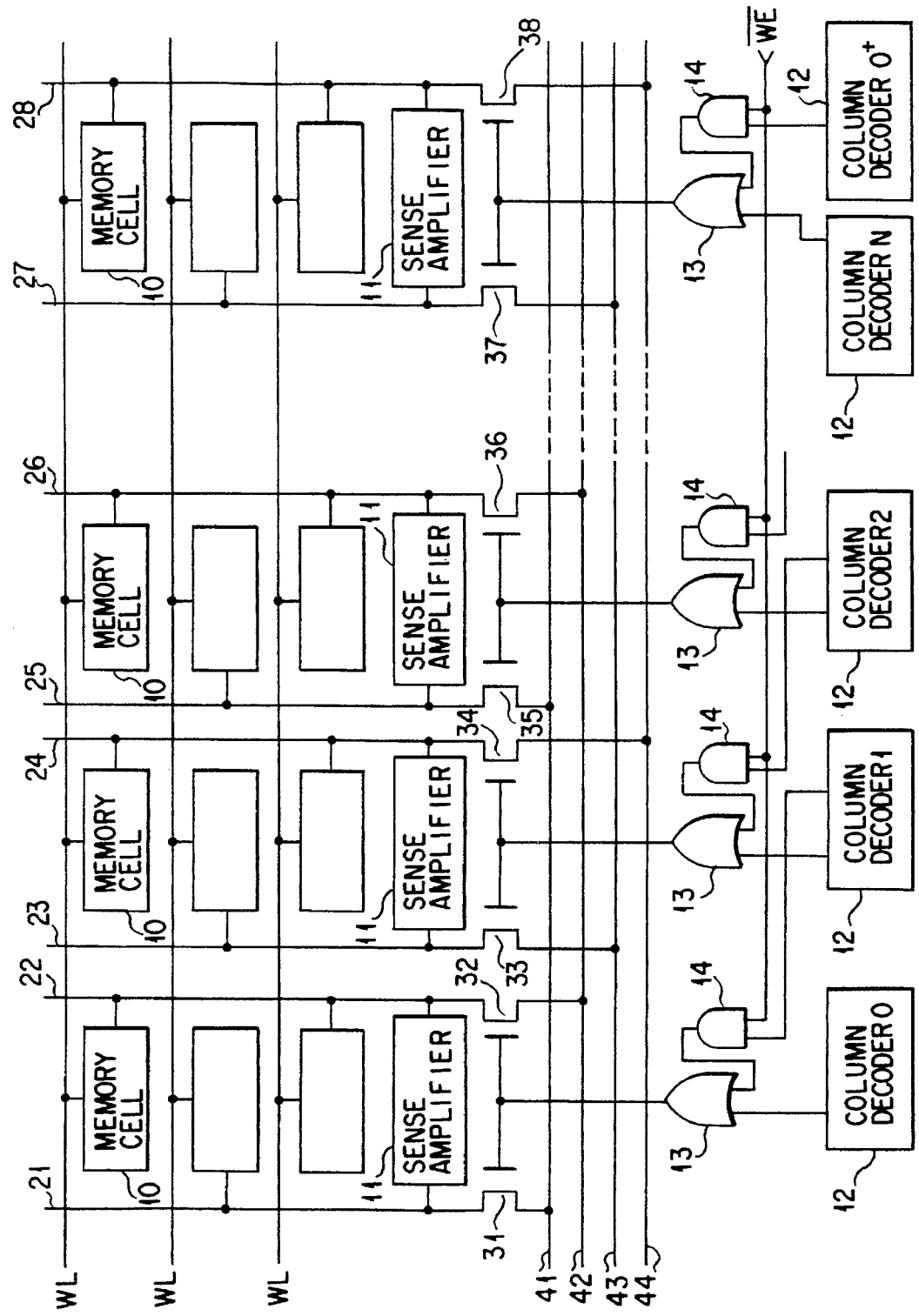
F I G. 2

SEMICONDUCTOR MEMORY DEVICE HAVING A COLUMN SELECTOR

BACKGROUND OF THE INVENTION

1. Field of the Invention

The present invention relates generally to a random access semiconductor memory (RAM) device, and more particularly to an improvement of column selection of a memory cell array.

2. Description of the Related Art

FIG. 6 shows part of a structure of a memory core portion of a conventional general purpose DRAM.

In the memory core portion, memory cells 10 are arranged in a matrix, forming a memory cell array. A sense amplifier 11 is connected to a pair of bit lines in each column of the cell array. The pair of bit lines (21, 22; 23, 24; . . . ) in each column is connected to a pair of common input/output data lines via a corresponding pair of column selection gates. Column decoders 12 are connected to the respective columns. The pair of column selection gates (31, 32; 33, 34; . . . ) in each column is controlled by an output of a corresponding column decoder 12. As a result, each column can be selected by an output of the corresponding column decoder both in writing and reading operations.

A conventional random access semiconductor memory, such as the aforementioned DRAM, has an architecture in which the number of column decoders is the same as that of column addresses, so that the same number of columns can be selected in both reading and writing operations.

A computer system in recent years tends to be formed as a so-called "system on chip", wherein a memory portion and a data processing function portion are mounted on the same semiconductor chip. When the "system on chip" is improved such that the memory itself has the data processing function portion or that an exclusive memory for a limited purpose is to be realized, a new architecture different from the above-described conventional architecture may be introduced with regard to selection of a column of the memory cell array, in which case, the number of columns selected in a reading operation can be different from the number of columns selected in a writing operation.

FIG. 7 shows a structure of a memory core portion in a case where an architecture, in which the numbers of selected columns are different in the reading and writing operations, is applied to a conventional DRAM having column decoders of a number which coincides with the number of column addresses.

The memory core portion has two pairs of input/output data lines (41, 42 and 43, 44) so that data of two bits can be simultaneously read. More specifically, the pair of bit lines of an odd column is connected to a first pair of input/output data lines (41 and 42) via a corresponding pair of column selection gates, while the pair of bit lines of an even column is connected to a second input/output data lines (43 and 44) via a corresponding pair of column selection gates. The memory core portion further includes a gate circuit comprising a two-input OR gate 13 and a two-input AND gate 14, which corresponds to a pair of column selection gates (31, 32; 33, 34; . . . ) in each column.

An output of the corresponding column decoder 12 is input to one input of each of the two-input OR gates 13 and an output of the corresponding two-input AND gate 14 is input to the other input of the gate 13. A write enable signal (/WE) is input to one input of each of the two-input AND gates 14 and an output of a column decoder (for example, "i+1"th) adjacent to the corresponding column decoder 12 ("i"th) is input to the other input of the gate 14.

In the above structure, during a writing operation, the signal /WE is "L" level, with the result that the output of the AND gate 14 in each column becomes "L" level. When an output of the column decoder 12 becomes "H" level, an output of the two-input OR gate 13 becomes "H" level, thereby turning on a pair of column selection gates, so that the corresponding column is selected. As a result, data is input to the selected column via the pair of input/output data lines (41, 42; or 43, 44), so that 1 bit data can be written in the memory cell of the column.

During a reading operation, the signal /WE is "H" level. An output from the gate of each column is "H" level, when an input from a column decoder 12 adjacent to the corresponding column decoder of the column decoder row is "H" level. Therefore, one column can be selected not only when an output of the corresponding column decoder (e.g., i) becomes "H" level and an output of the corresponding two-input OR gate 13 becomes "H" level, so that the corresponding pair of column selection gates 31 and 32 can be turned on, but also when an output of the adjacent column decoder (i+1) becomes "H" level and an output of the corresponding two-input OR gate 13 becomes "H" level, thereby turning on the corresponding pair of column selection gates 31 and 32.

In other words, in a reading operation, when an output of a column decoder 12 becomes "H" level, the corresponding column and a column corresponding to an adjacent column decoder are simultaneously selected. Hence, data of two bits are read through the two pairs of input/output data lines (41, 42; 43, 44).

The above system, in which two columns are accessed by means of a logical OR between outputs of two adjacent column decoders of the column decoders 12 of the same number as the number of column addresses, is called a two-column access system. When this system is to be employed in a memory device, only one column can be selected by an output of the corresponding one column decoder 12 in a column located at an end of the memory cell array (or a sub-array in a case where the array is divided into a plurality of blocks). This system is thus disadvantageous in that data of two bits cannot be read simultaneously.

As shown in FIG. 8, as regards a column located at an end (for example, the rightmost column in the drawing), i.e., the column corresponding to the most significant bit of the column address, although this column includes a column decoder (N), there is not column decoder adjacent thereto in the column decoder row (on the right side thereof in the drawing). Accordingly, it is impossible to arrange a logical gate so that the column can be selected when an output from the adjacent column decoder is "H" level. Hence, when the most significant column is designated in a reading operation, since only the most significant column is selected, data of only one bit can be read.

To solve this problem, it is proposed to constitute a memory device such that a column at an end of the memory cell array can be accessed by means of a logical OR between outputs from the two column decoders in the columns located both ends of the memory cell array, i.e., the two column decoders at both ends of the column decoder row.

In this case, however, it is necessary to arrange a long signal line for supplying an output from the column decoder at an end of the column decoder row to an input node of the logical gate of an output side of the column decoder at the other end of the column decoder row. This long signal line may cause a problem of a signal delay.

In addition, since the long signal line has a great parasitic capacitance, the column decoder which supplies an output to the signal line must have a greater driving capacity than the other column decoders. Therefore, the column decoders cannot be arranged in a regular pattern. Moreover, when the aforementioned signal line is arranged, the pattern layout of the column decoder row is inevitably limited.

As described above, in the conventional semiconductor memory device wherein the number of column decoders is the same as the number of columns, if an additional column is to be selected by a logical OR between outputs from a plurality of column decoders in order to access a plurality of columns simultaneously, a column located at an end of the memory cell array can be selected only by an output of the corresponding column decoder, i.e., only one column can be selected. Therefore, it is difficult to achieve a system in which a plurality of columns can be simultaneously accessed.

SUMMARY OF THE INVENTION

The present invention has been made to solve the above problem of the conventional art. It is accordingly an object of the present invention to provide a semiconductor memory device, wherein when an additional column is to be selected by means of a logical OR between outputs from a plurality of column decoders in order to access a plurality of columns simultaneously, even a column located at an end of the memory cell array can be selected by a logical OR between outputs from the corresponding column decoder and another column decoder.

A semiconductor memory device of the present invention comprises: a memory cell array in which a plurality of memory cells are arranged in a matrix, the memory cell array including a plurality of groups of columns; a plurality of column gates respectively connected to the plurality of columns of the memory cell array; a plurality of data lines provided for the plurality of groups of columns and connected in common to first ends of column gates of a corresponding group of columns; a column decoder row including column decoders of the number greater than the number of column addresses of the memory cell array, for decoding a column address signal which designates a column of the memory cell array; and a plurality of logical circuits, provided for columns of different column addresses in the memory cell array, for controlling the column gates of the respective columns by means of a logical OR between outputs from a predetermined plurality of column decoders for decoding different column addresses of the column decoder row.

According to the present invention, the number of column decoders for decoding column addresses to designate a column of the memory cell array is greater than the number of column addresses. With the above structure, a column corresponding to one column address can be selected by means of a logical OR between outputs from a plurality of column decoders for decoding different column addresses.

As a result, even a column located at an end of the memory cell array can be selected by means of a logical OR between outputs from the corresponding column decoder and another column decoder.

Further, the logical circuits are controlled by control signals which vary in logical level in reading and writing operations, with the result that the number of columns selected in the reading operation can be different from the number of columns selected in the writing operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram showing a modification of the memory core shown in FIG. 1;

DETAILED DESCRIPTION OF THE PREFERRED EMBODIMENTS

An embodiment of the present invention will be described in detail with reference to the accompanying drawings.

Figure 1:
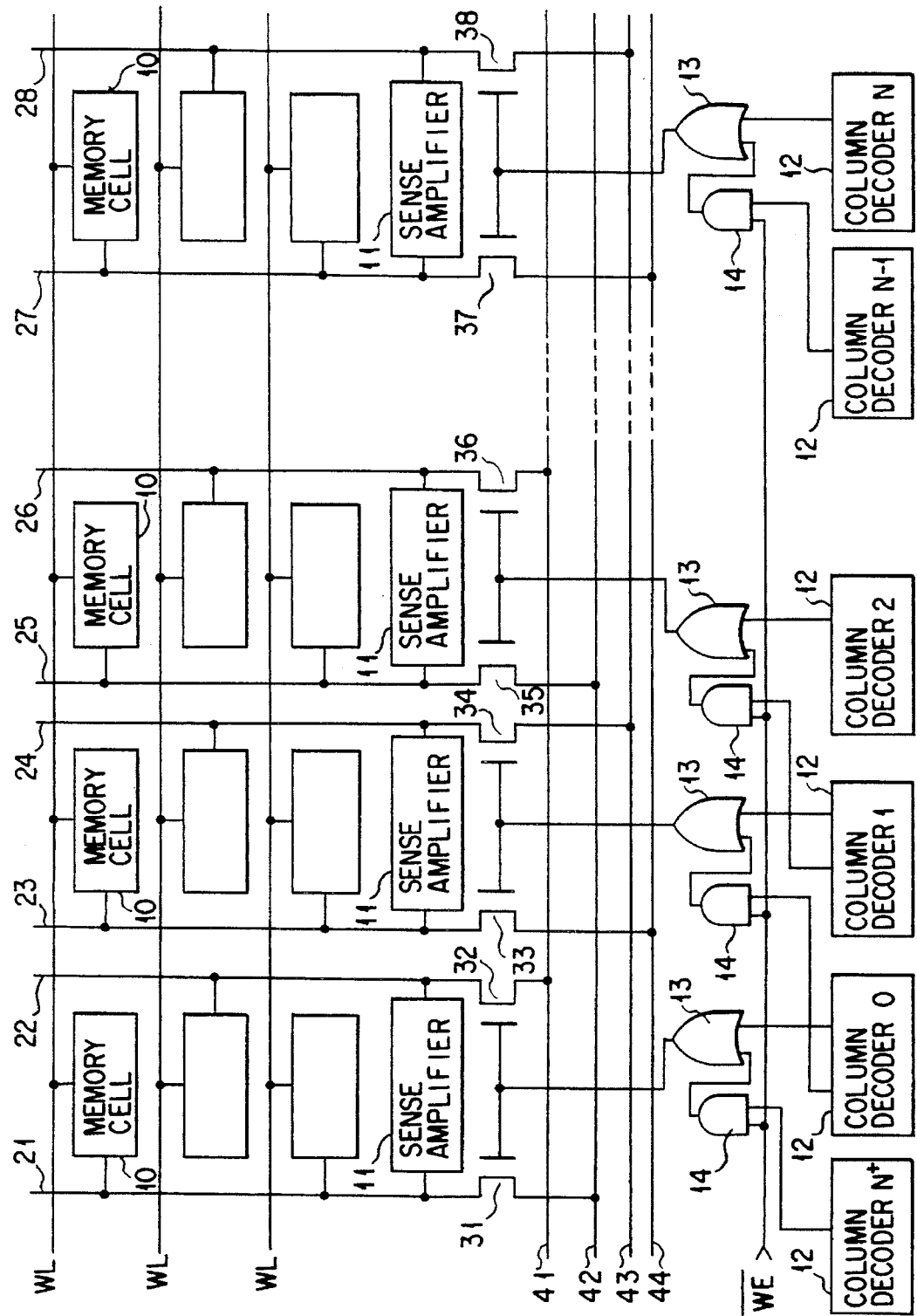
FIG. 1 is a circuit diagram showing part of a memory core portion of a DRAM according to a first embodiment of the present invention.

FIG. 1 is a circuit diagram showing part of a memory core portion of a DRAM according to a first embodiment of the present invention.

Memory cells 10 are arranged in a matrix, thereby forming a memory cell array. Each column of the memory cell array has a pair of bit lines (21, 22; 23, 24; ... ). Word lines WL are connected to the memory cells in the same row of the memory cell array. Sense amplifiers 11 are connected to the pairs of bit lines of the respective columns. A plurality of pairs of column gates (31, 32; 33, 34; ... ) are connected to the pairs of bit lines of the respective columns.

Column decoders 12 decode a column address signal for designating a column of the memory cell array. The number of the column decoders 12 is greater than the number of column addresses of the memory cell array.

The row i.e. the arrangement, of the column decoders 12 of this embodiment is comprised of a plurality of column decoders (0 to N) corresponding to the respective columns of the memory cell array and an additional column decoder (N⁺). The additional column decoder (N⁺) is to decode a column address which designates a column located at the right end in the drawing, i.e., the column corresponding to the most significant bit of the column address. Thus, in the embodiment shown in FIG. 1, a column decoder for decoding the column address, which designates the column at an end of the memory cell array, is provided at each end of the arrangement of the row of the column decoders 12.

Further, in the embodiment shown in FIG. 1, logical circuits are respectively provided for the columns of the different addresses in the memory cell array. In other words, the memory cell array includes the logical circuits of the number which coincides with the number of column address. Each logical circuit controls the column selection gate of the corresponding column by means of a logical OR between outputs of predetermined column decoders in the column decoder row (including the column decoder of the corresponding column) for decoding different column addresses.

In this embodiment, the logical circuits are provided in the respective columns of the memory cell array, so as to obtain a logical OR between outputs of two adjacent column decoders in the column decoder row. For example, a logical circuit comprising a two-input OR circuit (OR gate) 13 and a two-input AND circuit (AND gate) 14 is connected to each pair of column selection gates (31, 32; 33, 34; . . . ). A control signal, which varies in logical level in writing and reading operations, i.e., a write enable signal (/WE), is input to one input terminal of the two-input AND gate 14. An output of a column decoder 12 (an adjacent column decoder in this embodiment), which is different from the column decoder for decoding the column address of the corresponding column, is input to the other input terminal of the two-input AND gate 14. An output of the column decoder 12 for decoding the column address of the corresponding column is input to one input terminal of the two-input OR gate 13. An output of the corresponding two-input AND gate 14 is input to the other input terminal of the two-input OR gate 13.

The columns of the memory cell array are divided into a plurality of (two in this embodiment) groups. The pairs of data lines (41, 42; and 43, 44 in this embodiment) are provided for the respective groups. The plurality of pairs of data lines are connected to first ends of the pairs of column selection gates (31, 32; 33, 34; . . . ) of the respective groups. The memory cell array of this embodiment includes two pairs of input/output data lines (41, 42; and 43, 44), so that data of two bits can be simultaneously read. The pair of bit lines of an odd column is connected to a first pair of input/output data lines (41, 42) of the two pairs of the input/output data lines via the corresponding pair of column selection gates. The pair of bit lines of an even column is connected to a second pair of input/output data lines (43, 44) of the two pairs of input/output data lines via the corresponding pair of column selection gates.

With the above structure, in a writing operation, the signal/WE becomes "L" level and outputs from the AND gates 14 of the respective columns become "L" level. When an output of the column decoder 12 of a column becomes "H" level, an output from the corresponding two-input OR gate 13 becomes "H" level, thereby turning on the corresponding pair of column selection gates. As a result, data is input to the selected column through the first pair of input/output data lines (41, 42), so that data of one bit can be written in the memory cell of the selected column.

In a reading operation, the signal/ WE is "H" level. An output from the gate of each column is "H" level, when an input from a column decoder 12 adjacent to the corresponding column decoder of the column decoder row is "H" level. Therefore, one column can be selected not only when an output of the corresponding column decoder (e.g., 0) becomes "H" level and an output of the corresponding two-input OR gate 13 becomes "H" level, thereby turning on the corresponding pair of column selection gates 31 and 32, but also when an output of the adjacent column decoder (N⁺) becomes "H" and an output of the corresponding two-input OR gate 13 becomes "H" level, thereby turning on the corresponding pair of column selection gates 31 and 32.

In other words, in a reading operation, when an output of a column decoder 12 becomes "H" level, the corresponding column and a column corresponding to an adjacent column decoder are simultaneously selected. Hence, data of two bits are read through the two pairs of input/output data lines (41, 42; 43, 44).

In the DRAM of the embodiment as described above, the number of column decoders 12 for decoding a column address to designate a column of the memory cell array is greater than the number of column addresses. Hence, a column corresponding to one column address can be selected by means of a logical OR between outputs from two adjacent column decoders 12 for decoding different column addresses.

In this manner, even a column located at an end of the memory cell array can be accessed by means of a logical OR between outputs from the corresponding column decoder 12 and another column decoder 12 adjacent thereto.

Further, the logical circuits are controlled by control signals which vary in logical level in reading and writing operations, so that the number of columns selected in the reading operation can be different from the number of columns selected in the writing operation.

In the above embodiment, the additional column decoder (N⁺) is provided to decode a column address which designates the rightmost column in the drawing (the column corresponding to the most significant bit of the column address) of the memory cell array. However, the embodiment can be modified as shown in FIG. 2.

A memory core portion shown in FIG. 2 comprises an additional column decoder (0⁺) for decoding a column address which designates the leftmost column in the drawing (the column corresponding to the least significant bit of the column address) of the memory cell array. In FIG. 2, the same elements as shown in FIG. 1 are identified with the same reference numerals as used in FIG. 1.

In the above embodiment, a column is selected by means of a logical OR between outputs from two adjacent column decoders in the column decoder row. However, the embodiment can be modified as shown in FIG. 3, in which a column can be selected by means of a logical OR between outputs from two columns, not adjacent to each other, in the column decoder row.

Figure 3:
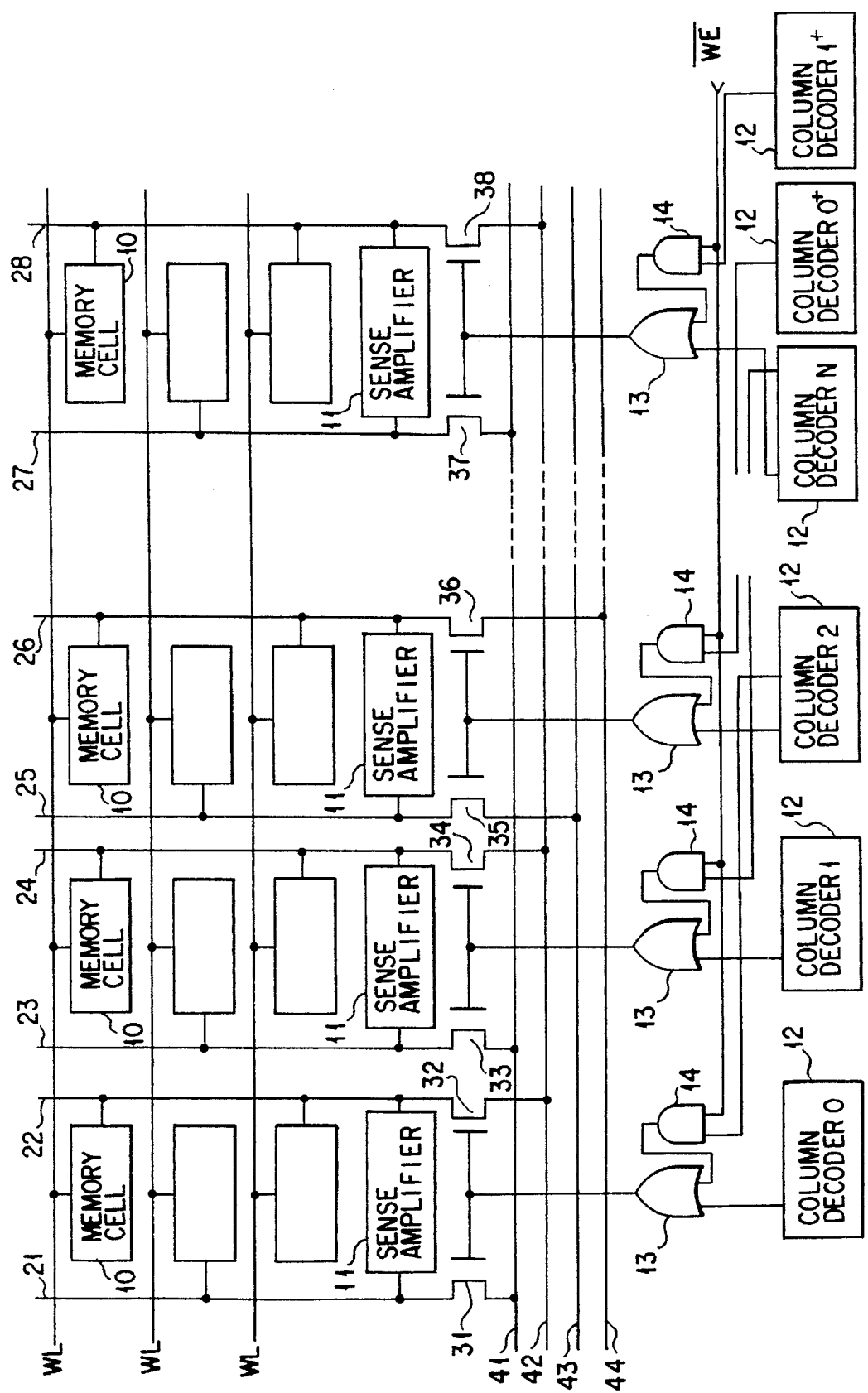
FIG. 3 is a circuit diagram showing another modification of the memory core shown in FIG. 1.

The memory core portion shown in FIG. 3 is the same as that shown in FIG. 1, except for the arrangement of column decoders and the connection of logical circuits. Hence, the same elements as shown in FIG. 1 are identified with the same reference numerals as used in FIG. 1.

In this modification, two additional column decoders 0⁺ and 1⁺ are provided at an end (the right end in FIG. 3) of the row of a plurality of column decoders 0 to N corresponding to the respective columns of the memory cell array. The two additional column decoders 0⁺ and 1⁺ are to decode column addresses decoded by column decoders 0 and 1, respectively.

Each of logical circuits (13, 14) is connected to a pair of two alternately located column decoders 12 so as to obtain a logical OR between outputs of the two column decoders 12.

Figure 4:
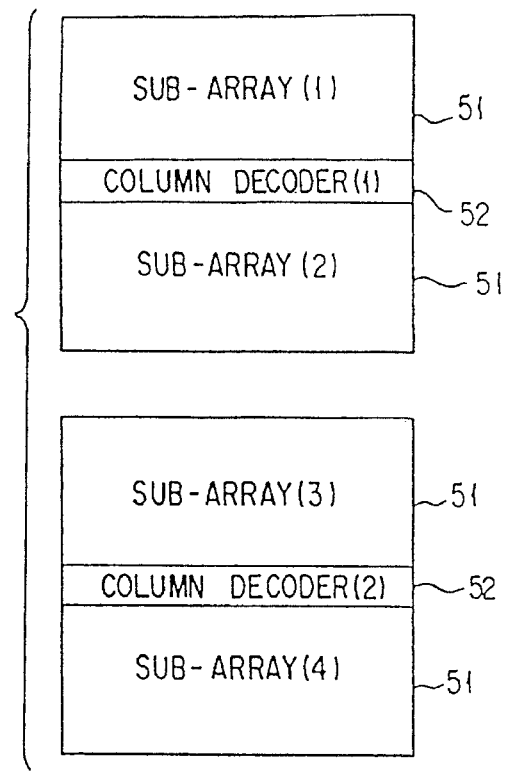
FIG. 4 is a circuit diagram showing part of a memory core portion of a DRAM according to a second embodiment of the present invention.

FIG. 4 shows part of a memory core portion of a DRAM according to a second embodiment of the present invention. The memory core portion shown in FIG. 4 is the same as that shown in FIG. 1, except that the memory cell array is divided into a plurality of blocks (sub-arrays) 51 and a column decoder row 52, common to two sub-arrays, is formed between the regions of the two sub-arrays.

The relationship between a sub-array 51 and a column decoder row 52 is the same as that in the memory core section shown in FIG. 1, 2 or 3. Therefore, a detailed structure of the second embodiment is not shown in the drawings.

Figure 5:
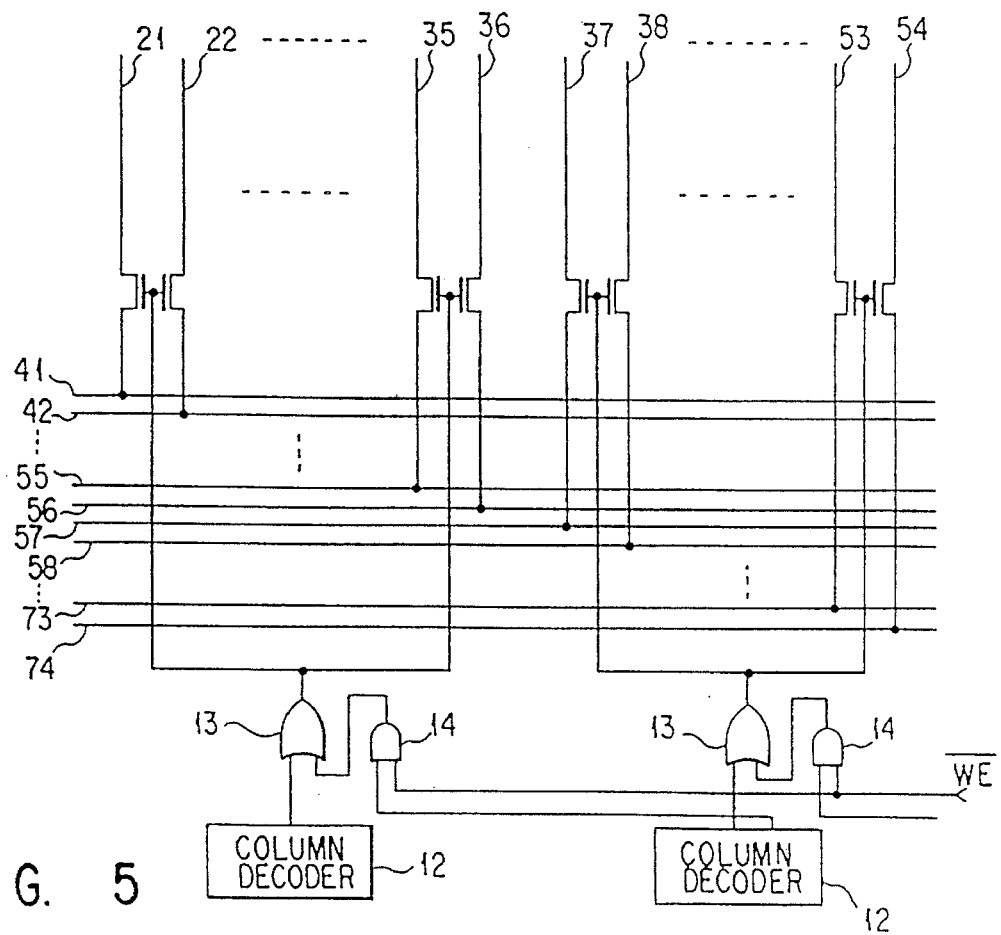
FIG. 5 is a circuit diagram showing part of a memory core portion of a DRAM according to a third embodiment of the present invention.
Figure 6:
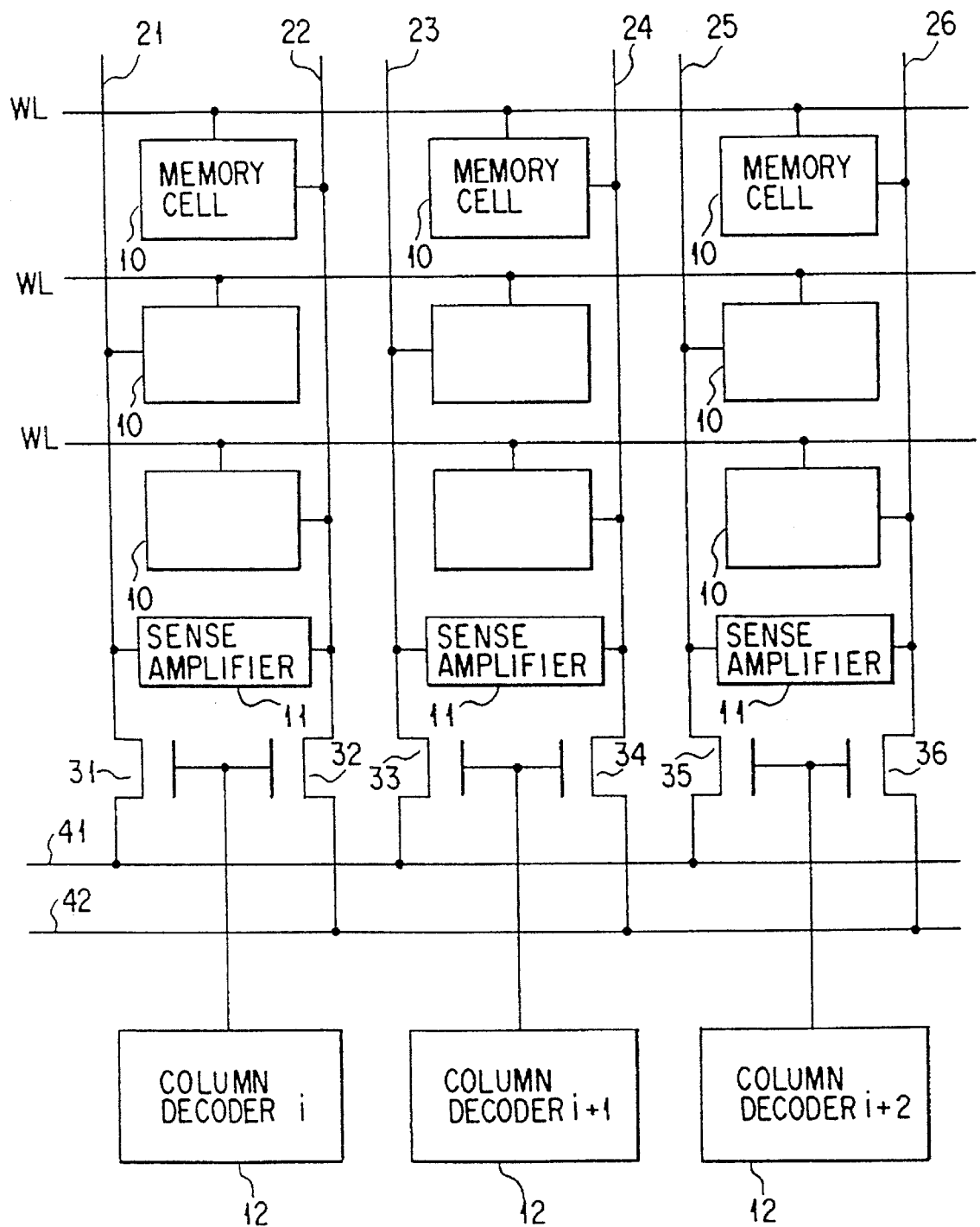
FIG. 6 is a circuit diagram showing part of a memory core portion of a conventional general-purpose DRAM.
Figure 7:
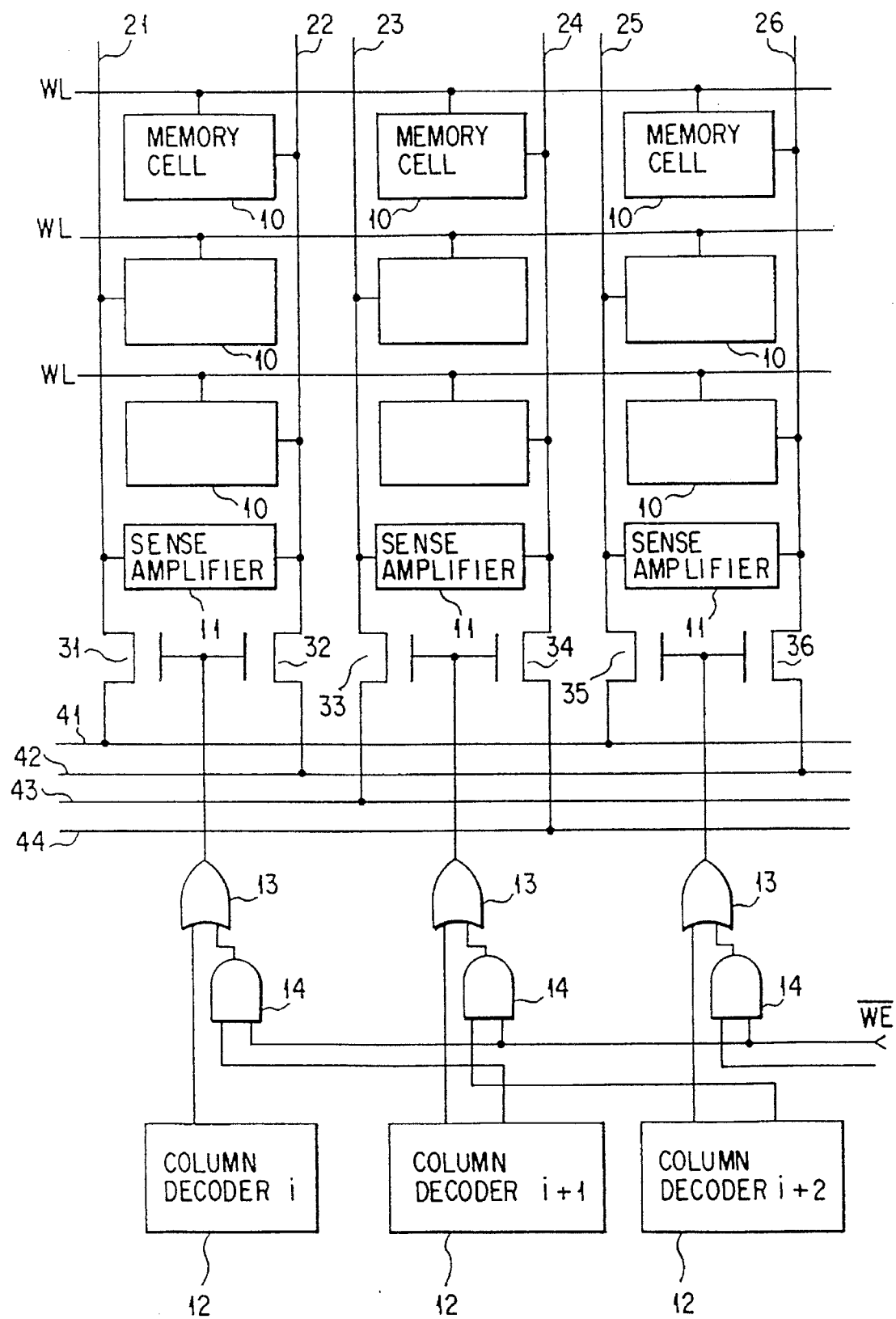
FIG. 7 is a circuit diagram showing part of a memory core portion proposed in a case where an architecture, in which the numbers of selected columns are different in the reading and writing operations, is applied to a conventional DRAM.
Figure 8:
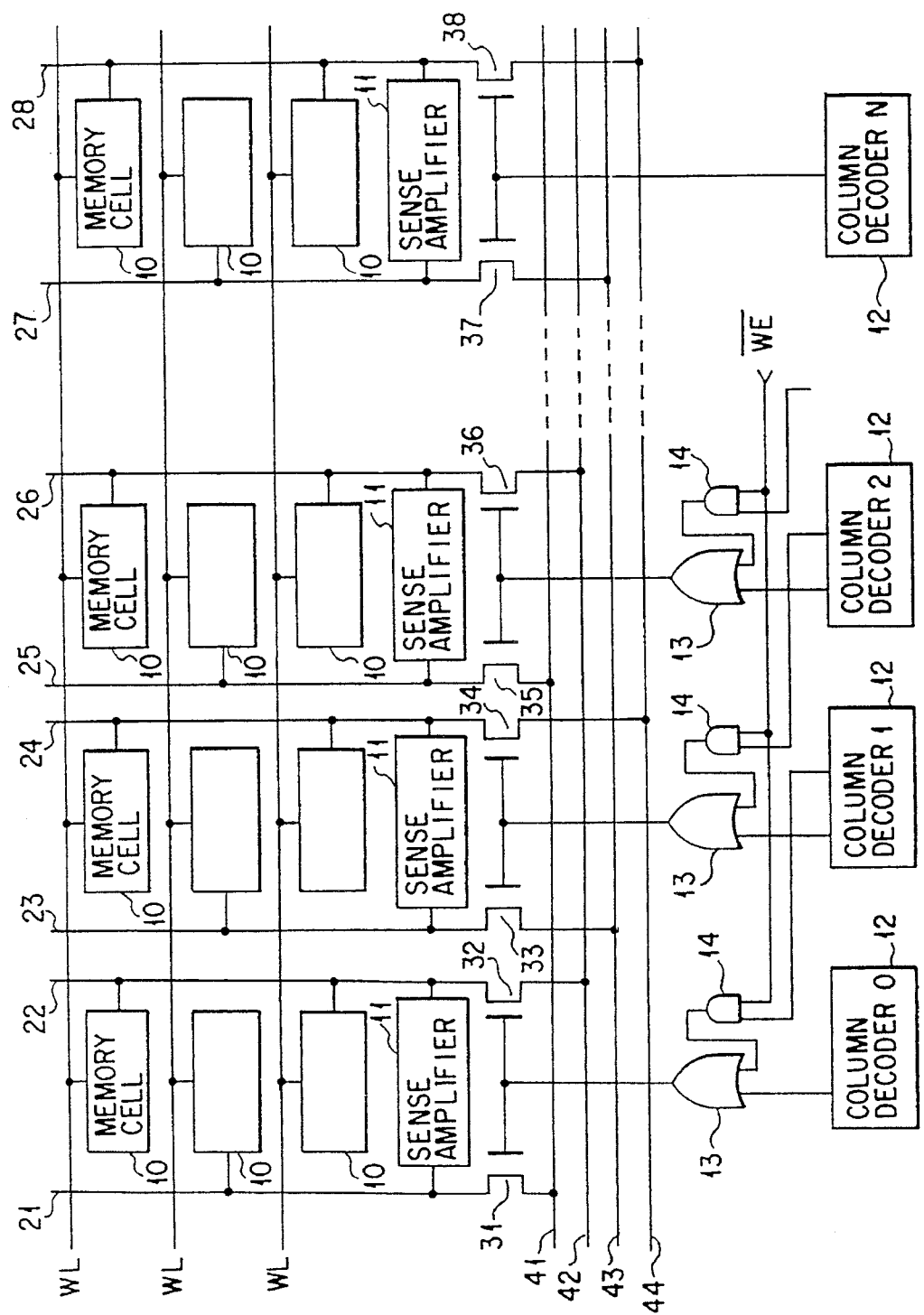
FIG. 8 is a block diagram showing an overall column decoder group shown in FIG. 7.

FIG. 5 shows part of a memory core portion of a DRAM according to a third embodiment of the present invention. The memory core portion shown in FIG. 5 is the same as those shown in FIGS. 1 to 3, except that one column address is assigned to eight columns so that data of 8 bit can be written simultaneously and data of 16 bit can be read simultaneously. Hence, the same elements as shown in FIG. 1 are identified with the same reference numerals as used in FIG. 1. As shown in FIG. 5, one logical circuit (13, 14) and one column decoder 12 are assigned to eight columns.

The third embodiment realizes a multi-bit DRAM having an architecture in which data of one byte can be written in a writing operation and data of 2 bytes can be read in a reading operation. With such a DRAM, the following functions can be achieved.

(1) A function of successively writing code data of two bytes into two different columns, revising data of one byte for code conversion, and then simultaneously reading code data of two bytes. With this function, code data of one byte can be converted to code data of two bytes.

(2) A function of successively writing data of two bytes, including a flag bit, into two different columns, revising data of one byte including the flag bit and then simultaneously reading code data of two bytes with this function, the number of bits, which are accessed in the data revision, can be reduced.

(3) A function of successively writing data of two bytes, consisting of RGB data for forming a colored image and luminance data, into two different columns, revising data of one byte including the luminance data for adjusting the tone of the colored image, and then simultaneously reading code data of two bytes. With this function, the number of bits, which are accessed in the data revision, can be reduced.

(4) A function of successively writing the same data of one byte into two different columns and simultaneously reading the two pieces of one byte data. With this function, the reliability of read data can be checked by detecting whether the two pieces of one byte data coincide with each other.

(5) A function of successively writing data of two field images, obtained by interlaced scanning, into two different columns and simultaneously reading the data of the two field images. With this function, it is possible to obtain data of one frame image of a non-interlaced style or a correlation between the two field images.

In the above-described embodiments, the number of columns selected in a reading operation is greater than the number of columns selected in a writing operation. However, the former can be less than the latter.

The arrangement of the column decoders and the interconnection between the column decoders and the logical circuits in the DRAM of each of the above embodiments can be variously modified. Further, the present invention can be applied not only to the DRAM but also the other semiconductor memories.

As has been described above, according to the present invention, there is provided a semiconductor memory device of the present invention, wherein when an additional column is to be selected by means of a logical OR between outputs from a plurality of column decoders in order to access a plurality of columns simultaneously, even a column located at an end of the memory cell array can be selected by a logical OR between outputs from the corresponding column decoder and another column decoder.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:
    a memory cell array in which a plurality of memory cells are arranged in a matrix, the memory cell array including a plurality of groups of columns;
    a plurality of column gates respectively connected to the plurality of columns of the memory cell array;
    a plurality of data lines provided for the plurality of groups of columns and connected in common to first ends of column gates of a corresponding group of columns;
    a column decoder row including column decoders, of the number greater than the number of column addresses of the memory cell array, for decoding a column address signal which designates a column of the memory cell array; and
    a plurality of logical circuits, provided for columns of different column addresses in the memory cell array, for controlling the column gates of the respective columns by means of a logical OR between outputs from a predetermined plurality of column decoders for decoding different column addresses of the column decoder row.

2. The semiconductor memory device according to claim 1, wherein at least one column decoder for decoding a column address which designates a column at an end of the memory cell array is connected to each of the ends of the column decoder row.

3. The semiconductor memory device according to claim 1, wherein each of the logical circuits carries out a logical OR between outputs of a pair of adjacent column decoders in the column decoder row.

4. The semiconductor memory device according to claim 2, wherein each of the logical circuits carries out a logical OR between outputs of a pair of adjacent column decoders in the column decoder row.

5. The semiconductor memory device according to claim 3, wherein at least one column decoder for decoding a column address which designates a column at an end of the memory cell array is connected to each of the ends of the column decoder row.

6. The semiconductor memory device according to claim 1, wherein at least one column decoder for decoding a column address which designates a column at an end of the memory cell array is connected to each of the ends of the column decoder row, and each of the logical circuits carries out a logical OR between outputs of adjacent two column decoders in the column decoder row.

7. The semiconductor memory device according to claim 1, wherein each of the logical circuits comprises:
   a logical AND circuit for carrying out a logical AND between a control signal, which varies in logical level in reading and writing operations, and output signals from column decoders of the predetermined number, different from a column decoder for decoding a column address of the column corresponding to the logical circuit; and
   a logical OR circuit for carrying out a logical OR between an output of the column decoder for decoding the column address of the column corresponding to the logical circuit and an output from the logical AND circuit.

8. The semiconductor memory device according to claim 2, wherein each of the logical circuits comprises:
   a logical AND circuit for carrying out a logical AND between a control signal, which varies in logical level in reading and writing operations, and output signals from column decoders of the predetermined number, different from a column decoder for decoding a column address of the column corresponding to the logical circuit; and
   a logical OR circuit for carrying out a logical OR between an output of the column decoder for decoding the column address of the column corresponding to the logical circuit and an output from the logical AND circuit.

9. The semiconductor memory device according to claim 3, wherein each of the logical circuits comprises:
   a logical AND circuit for carrying out a logical AND between a control signal, which varies in logical level in reading and writing operations, and output signals from column decoders of the predetermined number, different from a column decoder for decoding a column address of the column corresponding to the logical circuit; and
   a logical OR circuit for carrying out a logical OR between an output of the column decoder for decoding the column address of the column corresponding to the logical circuit and an output from the logical AND circuit.

10. The semiconductor memory device according to claim 4, wherein each of the logical circuits comprises:
    a logical AND circuit for carrying out a logical AND between a control signal, which varies in logical level in reading and writing operations, and output signals from column decoders of the predetermined number, different from a column decoder for decoding a column address of the column corresponding to the logical circuit; and
    a logical OR circuit for carrying out a logical OR between an output of the column decoder for decoding the column address of the column corresponding to the logical circuit and an output from the logical AND circuit.

11. The semiconductor memory device according to claim 5, wherein each of the logical circuits comprises:
    a logical AND circuit for carrying out a logical AND between a control signal, which varies in logical level in reading and writing operations, and output signals from column decoders of the predetermined number, different from a column decoder for decoding a column address of the column corresponding to the logical circuit; and
    a logical OR circuit for carrying out a logical OR between an output of the column decoder for decoding the column address of the column corresponding to the logical circuit and an output from the logical AND circuit.

12. The semiconductor memory device according to claim 6, wherein each of the logical circuits comprises:
    a logical AND circuit for carrying out a logical AND between a control signal, which varies in logical level in reading and writing operations, and output signals from column decoders of the predetermined number, different from a column decoder for decoding a column address of the column corresponding to the logical circuit; and
    a logical OR circuit for carrying out a logical OR between an output of the column decoder for decoding the column address of the column corresponding to the logical circuit and an output from the logical AND circuit.

13. A semiconductor memory device, comprising:
    a memory cell array having rows and columns of memory cells;
    column decoders for decoding column addresses, wherein the number of column decoders is greater than the number of columns of memory cells of said memory cell array; and
    logic circuits for logically combining outputs of said column decoders and outputting output signals for selecting one or more columns of memory cells of said memory cell array.

14. The semiconductor memory device according to claim 13, further comprising:
    data lines; and
    column gates responsive to the output signals of said logic circuits for electrically connecting the selected columns of memory cells of said memory cell array to said data lines.

15. The semiconductor memory device according to claim 13, further comprising:
    bit line pairs each connected to the memory cells in a respective corresponding column of memory cells of said memory cell array;
    first and second data line pairs;
    first column gate pairs each arranged between one of the bit line pairs of a first group of bit line pairs and said first data line pair, each first column gate pair supplied with the output signal of a respective corresponding one of said logic circuits; and
    second column gate pairs each arranged between one of the bit line pairs of a second group of bit line pairs and said second data line pair, each second column gate pair supplied with the output signal of a respective corresponding one of said logic circuits.

16. The semiconductor memory device according to claim 15, wherein said semiconductor memory device is operable in a first mode in which the output signals of said logic circuits switch ON (1) one of said first column gate pairs to thereby electrically connect one of the bit line pairs of said first group of bit line pairs to said first data line pair; or (2) one of said second column gate pairs to thereby electrically connect one of the bit line pairs of said second group of bit line pairs to said second data line pair, and wherein said semiconductor memory device is further operable in a second mode in which the output signals of said logic circuits switch ON (1) one of said first column gate pairs to thereby electrically connect one of the bit line pairs of said first group of bit line pairs to said first data line pair; and (2) one of said second column gate pairs to thereby electrically connect one of the bit line pairs of said second group of bit line pairs to said second data line pair.

17. The semiconductor memory device according to claim 16, wherein the first mode is data write mode and the second mode is a data read mode.

18. The semiconductor memory device according to claim 15, wherein each said logic circuit includes:

a first logic gate for logically combining an output of a first column decoder corresponding to a first column address and a signal whose logic level varies in accordance with an operation mode of said semiconductor memory device; and a second logic gate for logically combining an output of said first logic gate and a second column decoder corresponding to a second column address which is different than the first column address.

19. The semiconductor memory device according to claim 18, wherein said first logic gate is an AND gate and said second logic gate is an OR gate.

20. The semiconductor memory device according to claim 18, wherein said column decoders are arranged in a column decoder row, the number of column decoders is one more than the number of columns of memory cells, and said first column decoder and said second column decoder are adjacent to each other.

21. The semiconductor device according to claim 18, wherein said column decoders are arranged in a column decoder row and at least one other column decoder is arranged between said first and second column decoders.

22. The semiconductor memory device according to claim 13, further comprising another memory cell array having rows and columns of memory cells, wherein said column decoders are arranged between said memory cell array and said another memory cell array.

23. The semiconductor memory device according to claim 13, further comprising:

bit line pairs each connected to the memory cells in a respective corresponding column of memory cells of said memory cell array;

first and second data line pairs;

a first column gate pair arranged between one of the bit line pairs of a first group of bit line pairs and said first data line pair; and a second column gate pair arranged between one of the bit line pairs of a second group of bit line pairs and said second data line pair, wherein said first and second column gate pairs are both supplied with the output signal of the same one of said logic circuits.

24. The semiconductor memory device according to claim 13, further comprising:

bit line pairs each connected to the memory cells in a respective corresponding column of memory cells of said memory cell array;

first, second, third, and fourth data line pairs;

first column gate pairs each arranged between one of the bit line pairs of a first group of bit line pairs and said first data line pair;

second column gate pairs each arranged between one of the bit line pairs of a second group of bit line pairs and said second data line pair;

third column gate pairs each arranged between one of the bit line pairs of a third group of bit line pairs and said third data line pair; and fourth column gate pairs each arranged between one of the bit line pairs of a fourth group of bit line pairs and said first data line pair, wherein one of said first column gate pairs and one of said second column gate pairs are both supplied with the output signal of a same first one of said logic circuits, and one of said third column gate pairs and one of said fourth column gate pairs are both supplied with the output signal of a same second one of said logic circuits.

25. The semiconductor memory device according to claim 13, wherein said memory cells are dynamic random access memory cells.

26. The semiconductor memory device according to claim 13, wherein said column decoders include first and second column decoders, each of said first and second column decoders decoding a column address for the same column of memory cells of said memory cell array.

27. The semiconductor memory device according to claim 26, wherein said first and second column decoders each decode a column address for the column corresponding to the most significant bit of the column address.

28. The semiconductor memory device according to claim 26, wherein said first and second column decoders each decode a column address for the column corresponding to the least significant bit of the column address.

29. The semiconductor memory device according to claim 13, wherein said column decoders include first and second column decoders each of which decodes a column address for a same first column of memory cells of said memory cell array, and said column decoders further include third and fourth decoders each of which decode a column address for a same second column of memory cells of said memory cell array.

30. The semiconductor memory device according to claim 13, wherein each logic circuit combines outputs from at least two column decoders, each of which decodes a different column address, and outputs an output signal for selecting a respective corresponding one of said columns of said memory cell array.

* * * * *